United States Patent
Prior et al.

(10) Patent No.: US 8,258,823 B2
(45) Date of Patent: Sep. 4, 2012

(54) METHOD OF AND DRIVER CIRCUIT FOR OPERATING A SEMICONDUCTOR POWER SWITCH

(75) Inventors: Oliver Prior, Marsberg (DE); Tobias Strubel, Niestetal (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 13/294,362

(22) Filed: Nov. 11, 2011

(65) Prior Publication Data

US 2012/0112800 A1    May 10, 2012

Related U.S. Application Data

(63) Continuation of application No. PCT/EP2010/056471, filed on May 11, 2010.

(30) Foreign Application Priority Data

May 11, 2009    (EP) ..................................... 09159930

(51) Int. Cl.
*H03K 3/00* (2006.01)
(52) U.S. Cl. ........................................ 327/108; 327/112
(58) Field of Classification Search ........... 327/108–112
See application file for complete search history.

(56) References Cited

U.S. PATENT DOCUMENTS

| 8,040,162 | B2 * | 10/2011 | Miyazaki | ...................... 327/108 |
| 2004/0257155 | A1 | 12/2004 | McEwen | |

FOREIGN PATENT DOCUMENTS

DE    3718001 A1    12/1988

OTHER PUBLICATIONS

International Search Report for PCT/EP2010/056471 dated Jun. 25, 2010, p. 1-4.
Written Opinion of the International Searching Authority dated Nov. 15, 2011. 6 Pages.

* cited by examiner

*Primary Examiner* — Kenneth B. Wells
(74) *Attorney, Agent, or Firm* — Eschweiler & Associates, LLC

(57) ABSTRACT

To operate a semiconductor power switch having a control electrode and a reference electrode in response to first and second switching commands, a control voltage between a first electric pole and a second electric pole is provided. Upon each first switching command, the control electrode is coupled to the first electric pole, and the reference electrode is coupled to the second electric pole; and upon each second switching command, the control electrode is coupled to the second electric pole, and the reference electrode is coupled to the first electric pole. Upon each switching command, continuously transitioning an electric potential of the one of the control and reference electrodes during a first transition period, and continuously transitioning an electric potential of the respective other of the control and reference electrodes during a second transition period occurs, wherein the first transition period beginning before and ending after the second transition period.

20 Claims, 7 Drawing Sheets

METHOD OF AND DRIVER CIRCUIT FOR OPERATING A SEMICONDUCTOR POWER SWITCH

CROSS REFERENCE TO RELATED APPLICATIONS

This application is a continuation of International Application No. PCT/EP2010/056471 filed on May 11, 2010 entitled "Method of and Driver Circuit for Operating a Semiconductor Power Switch," which claims priority to European Patent Application No. 09 159 930.8 entitled, "Verfahren and Treiberschaltung zum Treiben eines Halbieiterleistungsschalters," filed on May 11, 2009 and is herein incorporated by reference.

FIELD

The invention relates to a method of, and a driver circuit for, operating a semiconductor power switch. More particularly, the invention relates to a method of, and a driver circuit for, operating a semiconductor power switch having a control electrode and a reference electrode in response to first and second switching commands included in a control signal.

BACKGROUND

Usually, each first switching command comprises a change from a first value of the control signal to a second value of the control signal and requests the semiconductor power switch to be switched (e.g., turned on), and each second switching command comprises a change from the second value of the control signal to the first value of the control signal and requests the semiconductor power switch to be switched (e.g., turned off). The control signal generally is a digital signal in which the first and second value represent a logical zero and a logical one, respectively, or vice-versa.

The semiconductor power switch includes a voltage-controlled component such as an IGBT or a field-effect transistor. Although the semiconductor power switch may generally be either normally non-conductive or normally conductive if no voltage is applied to its control electrode, the following description focuses on normally non-conductive semiconductor power switches.

Many electronic power circuits include semiconductor switches that are nonconductive if no voltage is present at their control electrodes and become conductive when a control voltage is applied to their control electrodes (or vice-versa). Semiconductor power switches with insulated control electrodes (e.g., MOSFET or IGBT) normally operate at control voltages ranging from 10 to 15 volts.

If the semiconductor power switch is to become non-conductive, switching off the voltage applied to the control electrode may be sufficient in some applications. This is especially advantageous as only a single driver supply voltage is required. In many cases a simple bootstrap circuit may be used to supply this voltage.

In situations where the semiconductor power switch is operated in a bridge circuit (i.e., in a half or full bridge), it may however often be necessary to apply an inverted potential difference to its control electrode so that the power switch remains non-conductive even during transient processes. Integrated driver circuits currently available on the market are generally designed for operating voltages ranging from 15 to 20 volts. This may limit the maximum difference of the voltages that can be applied to the control electrodes.

If a higher difference of the voltages is needed to activate the semiconductor power switch, then the driver may in principle be designed using discrete and sufficiently voltage-proof components. Alternatively, the voltage can be converted to a higher level by means of a control voltage converter. Both solutions entail a significant amount of effort. The second solution is furthermore unsuitable for generating static voltages at the control electrode of the semiconductor power switch.

Published German Patent Application DE 37 18 001 A1 discloses a circuit arrangement configured to generate bipolar digital data signals from unipolar data signals which, in response to the unipolar data signals, connects a circuit output with the positive or negative terminal of a unipolar voltage source. To this end, the circuit arrangement features a switch combination implemented by inverters.

Published US Patent Application US 2004/0257155 A1 discloses an optically isolated bias control circuit that provides bias current for switching circuits, which may be used to control the switching of high power MOSFET-based switching circuits. The bias control circuit comprises a floating bias voltage source positive terminal electrically connected in series to the collector of a first photo-transistor. The emitter of the first photo-transistor is connected in series through an inductance to the parallel connected N-channel enhancement-mode MOSFET gate and to the collector of a second photo-transistor. The emitter of the second photo-transistor is connected to both the MOSFET source and to the negative terminal of the bias voltage source. Operation of this bias control circuit requires two complementary "ON" and "OFF" light signal pulses to be applied to the light sensitive base regions of the first and second photo-transistors, respectively. Minimal charge flow is achieved by allowing the active high "ON" light signal to be applied in the high state to the first photo-transistor only when the active high "OFF" light signal applied to the second photo-transistor is in the low state. This prevents the direct shorting of the bias voltage source through both photo-transistors and reduces the flow of charge required to control the MOSFET switching circuit. It is important to apply "ON" and "OFF" light signal pulses which have minimal rise and fall times to ensure that the MOSFET is driven as fast as possible through its switching states. The inductance in series with the gate is properly selected small to reduce switching losses by appropriately slowing the gate capacitor charging time. By using two additional optically isolating photo-transistors the polarity of the bias voltage source applied to the gate-to-source circuit of the MOSFET is effectively reversed in order to force the circuit off as fast as it is forced on.

There remains a need for a method of and a driver circuit for operating a semiconductor power switch having a control electrode and a reference electrode in response to first and second switching commands included in a control signal, which allow for precisely clocking fast switching semiconductor power switches at even high frequencies.

SUMMARY

In one embodiment, the present invention provides a method of operating a semiconductor power switch having a control electrode and a reference electrode in response to first and second switching commands included in a control signal. The method comprises providing a control voltage between a first electric pole and a second electric pole, and upon each first switching command, coupling the control electrode to the first electric pole, and the reference electrode to the second electric pole. Upon each second switching command, the method comprises coupling the control electrode to the second electric pole, and the reference electrode to the first electric pole. Upon each switching command, coupling one of the control and the reference electrodes to one of the first and second electric poles comprises continuously transitioning an electric potential of the one of the control and reference electrodes during a first transition period. Further, coupling the respective other of the control and reference electrodes to the respective other of the first and second electric poles comprises continuously transitioning an electric potential of the respective other of the control and reference electrodes during a second transition period, the first transition period beginning before and ending after the second transition period.

In another embodiment, the present invention provides a driver circuit for operating a semiconductor power switch having a control electrode and a reference electrode. The driver circuit comprises a first half-bridge configured to alternately couple one of the control and reference electrodes to a first electric pole and to a second electric pole of a control voltage, and a second half-bridge configured to alternately couple the respective other of the control and reference electrodes to the second electric pole and to the first electric pole of the control voltage. The driver circuit also comprises control circuitry configured to operate the first and second half-bridges in response to first and second switching commands included in a control signal, such that, upon each first switching command, the control electrode is coupled to the first electric pole, and the reference electrode is coupled to the second electric pole. Further, upon each second switching command, the control electrode is coupled to the second electric pole, and the reference electrode is coupled to the first electric pole, and is configured to, upon each switching command, continuously transition an electric potential of the one of the control and reference electrodes during a first transition period of the first half-bridge, and continuously transition an electric potential of the respective other of the control and reference electrode during a second transition period of the second half-bridge, wherein the first transition period begins before and ends after the second transition period.

Other features and advantages of the present invention will become apparent to one with skill in the art upon examination of the following drawings and the detailed description. It is intended that all such additional features and advantages be included herein within the scope of the present invention, as defined by the claims.

BRIEF DESCRIPTION OF THE DRAWINGS

The invention will be better understood with reference to the following drawings. The components in the drawings are not necessarily to scale, emphasis instead being placed upon clearly illustrating the principles of the present invention. In the drawings, like reference numerals designate corresponding parts throughout the several views.

DETAILED DESCRIPTION

Figure 1:
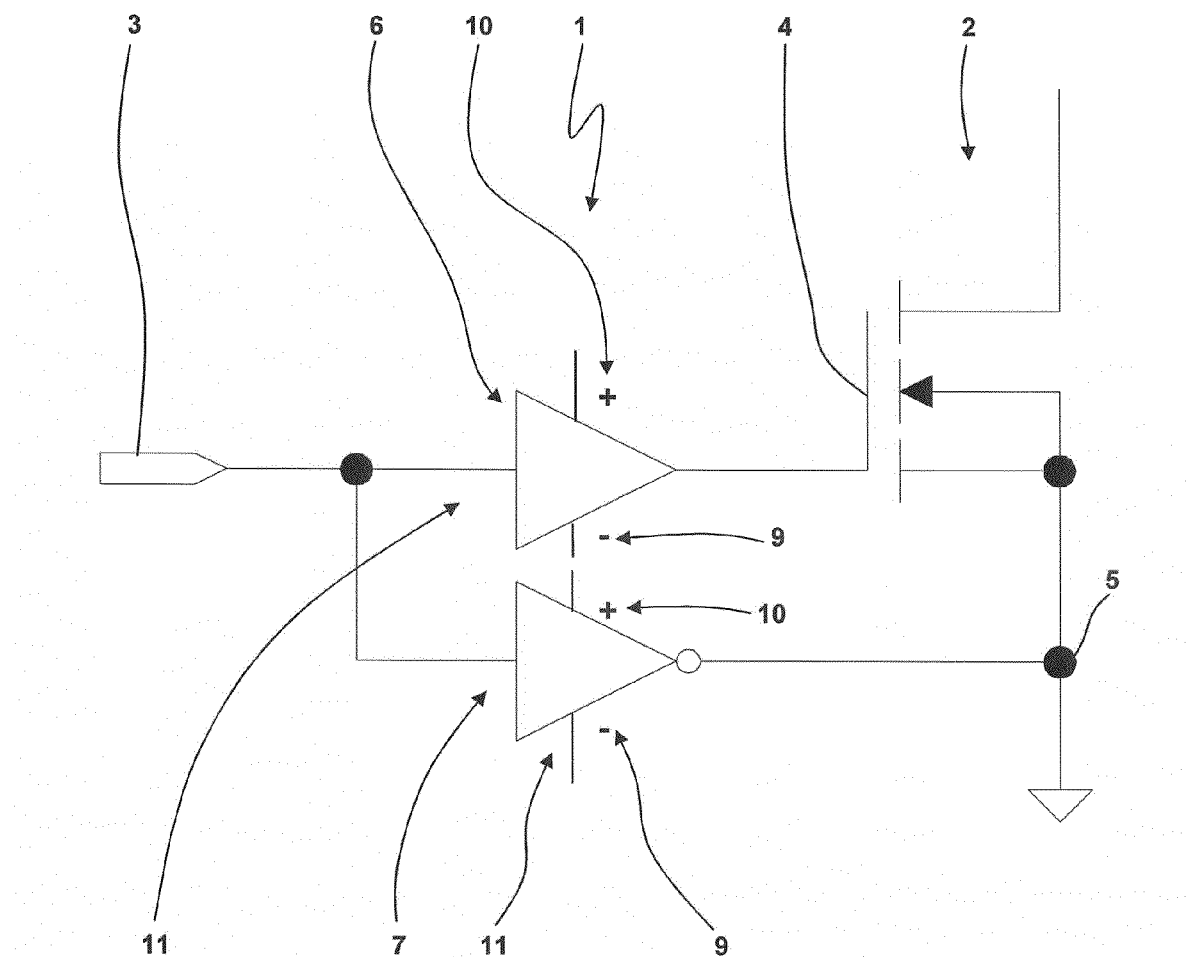
FIG. 1 depicts a basic circuit diagram of a first embodiment of the driver circuit.

In the new method of operating a semiconductor power switch in response to a digital control signal, a control electrode and a reference electrode of the semiconductor power switch are each connected to one of the two poles of a driver supply voltage and the connections of both poles of the driver supply voltage to the control electrode on one side and to the reference electrode on the other side are inverted whenever the digital control signal is changed. Thus, there is no fixed potential reference between a circuit ground of the driver and the reference electrode of the power switch. The reference electrode (i.e., the source or emitter terminal) is connected to the other pole of the driver supply voltage than the control electrode. This means that the connection of both poles of the driver supply voltage to the control electrode, on one side, and the reference electrode, on the other side, is inverted whenever the digital control signal changes to provide a switching command for modifying the switching status of the semiconductor power switch. As a result, both a positive and a negative potential difference can be generated between the control and reference electrodes of the semiconductor power switch using a single driver supply voltage. As compared to presently commercially available driver circuits, a double output voltage difference arises for the same voltage load to the components used.

The new method of operating a semiconductor power switch is implemented in the new driver circuit by means of two half-bridges (i.e., one full bridge) which alternately connect the control electrode and reference electrode of the semiconductor power switch to both poles of the driver supply voltage. The bridge circuit may be composed of discrete components. However, two commercially available integrated driver components or a double driver may also be used for implementing both half-bridges.

Regarding the practical implementation of the new method and driver circuit, it has proven to be comparatively difficult to implement exactly the same time for switching both electrodes of the semiconductor power switch between the two poles of the driver supply voltage. In case of different switching times, the potential difference between both electrodes equals zero for a short time (i.e., the time between the two switching instances). In principle, such a potential curve should not pose a problem to the activation of most semiconductor power switches. In practice, however, parasitic inductances and capacities (e.g., in the form of line inductances and the input capacity of the semiconductor power switch) interfere with the potential curve. As a result, the initial switching process can cause potential oscillations around the theoretical potential difference of zero. In extreme cases, these oscillations turn the semiconductor power switch on and off repeatedly, if they extend into the active switching range of the semiconductor power switch.

To prevent the semiconductor power switch from being turned on and off again in this manner, which occurs especially in fast-switching semiconductor power switches, the relevant line inductances could be minimized and/or the two switching processes of both electrodes on the semiconductor power switch could be synchronized between the poles of the driver supply voltage. Both measures, however, would require substantial effort to actually achieve the desired goal.

In the new method and driver circuit for operating a semiconductor power switch, the two electrodes are switched between the two poles of the driver supply voltage at different speeds such that the potential transition at the two electrodes has different gradients. In concrete terms, one of the control and reference electrodes switches between the two poles of the driver supply voltage in such a way that a prolonged steady potential transition occurs at that electrode. This prolonged steady and preferably linear potential transition does not induce potential oscillations to any relevant extent. Nevertheless, it shifts the potential of the one of the control and reference electrodes of the semiconductor power switch so that the potential difference between the two electrodes of the semiconductor power switch no longer approaches zero when the respective other electrode is subsequently switched between the two poles of the driver supply voltage, i.e. the potential difference does not pass through the switching range of the semiconductor power switch again even if potential oscillations induced by this fast switching process are present.

In the present invention, the potential difference between the two electrodes passes through this switching range of the semiconductor switch rather fast during the continuously fast switching of the other electrode between the two poles of the driver supply voltage.

Typically, the first and second switching commands requesting the driver circuit to turn the semiconductor power switch on and off are coded in the control signal in that each first switching command comprises a change from a first value of the control signal to a second value of the control signal, and each second switching command comprises a change from the second value of the control signal to the first value of the control signal. In a digital control signal, one of the first and second values of the control signal will be a logical 0 (zero), whereas the respective other value will be a logical 1 (one).

In one embodiment of the present invention, the duration of the prolonged potential transition is at least about five times longer than the fast potential transition. In general, it can be about three times to about fifty times longer. However, it is desirable in one embodiment to have it last no longer than about ten times in order to complete the entire switching process in the shortest time possible.

To ensure that the fast potential transition always occurs during the prolonged potential transition at the one of the control and reference electrodes of the semiconductor power switch when switching the respective other electrode between the poles of the driver supply voltage, in one embodiment the present invention delays the beginning of the shorter potential transition with respect to the beginning of the prolonged potential transition. This delay typically ranges from a minimum of 10% to a maximum of 90% of the duration of the prolonged potential transition. In one embodiment, the beginning of the shorter potential transition would be anywhere from 20% to 80% of the duration of the prolonged potential transition.

In one embodiment, the first transition period is prolonged as compared to the second transition period and the second transition period is delayed as compared to the first transition period, such that a period is minimized during which the potential difference between the control electrode and the reference electrode is within a switching range of the power semiconductor switch. To this end, the control circuitry in one embodiment is configured to operate the first half-bridge slower than the second half-bridge and the second half-bridge at a delay as compared to the first half-bridge, such that a period is minimized during which the potential difference between the control electrode and the reference electrode is within a switching range of the power semiconductor switch If the semiconductor power switch does not have a switching range with a zero potential difference between the two electrodes—which is normally the case but rather with a positive (or negative) voltage, it is not desired in one embodiment to have the chronological order between the beginning of the prolonged potential transition and the shorter potential transition be the same for both switching directions of the electrodes of the power switch between the two poles of the driver supply voltage. Instead, a delay that varies in response to the switching direction has proven advantageous to pass through the switching range of the semiconductor power switch with the potential difference between the two electrodes during the shorter potential transition on the other electrode.

Based on experiences with an actual implementation of the invention, it may be expedient in one embodiment to have the one electrode where a prolonged potential transition is supplied serving as the control electrode of the semiconductor power switch while the other electrode where a delayed albeit faster potential transition occurs serves as the reference electrode of the semiconductor power switch.

The driver circuit for a semiconductor switch configured to implement the new method has two half-bridges that alternately connect the control electrode and the reference electrode of the semiconductor power switch to the two poles of the driver supply voltage. Whenever the control signal is changed, one of the two half-bridges switches between the two poles of the driver supply voltage such that a prolonged and steady potential transition occurs at one of the electrodes as a result, whereas the respective other of the two half-bridges switches between the two poles of the driver supply voltage such that a delayed albeit shorter potential transition occurs at the other electrode during the prolonged potential transition at the one of the electrodes.

As indicated previously, the half-bridges of the driver circuit used to implement the method may be configured in different ways. Actual embodiment examples will be discussed in the following.

Referring now in greater detail to the drawings, a driver circuit 1 outlined in FIG. 1 is used to operate a semiconductor power switch 2 (which is depicted as MOSFET here) in response to a digital control signal 3. The driver circuit 1 applies a potential difference between a control electrode 4 of the semiconductor power switch 2, the gate of the MOSFET, and a reference electrode 5 of the semiconductor power switch 2, the source of the MOSFET. This potential difference is generated with two driver components 6 and 7 from a single driver supply voltage by alternately coupling both poles 9 and 10 of the driver supply voltage to the two electrodes 4 and 5. The driver component 7 is equipped with an inverter. For one value of the digital control signal 3, the potential difference between the electrodes 4 and 5 corresponds to the driver supply voltage, and for the other value of the digital control signal 3, it corresponds to the driver supply voltage with the sign reversed. In other words, the maximum potential difference between the electrodes 4 and 5 is doubled by the driver circuit 1 as compared to the driver supply voltage.

Figure 2:
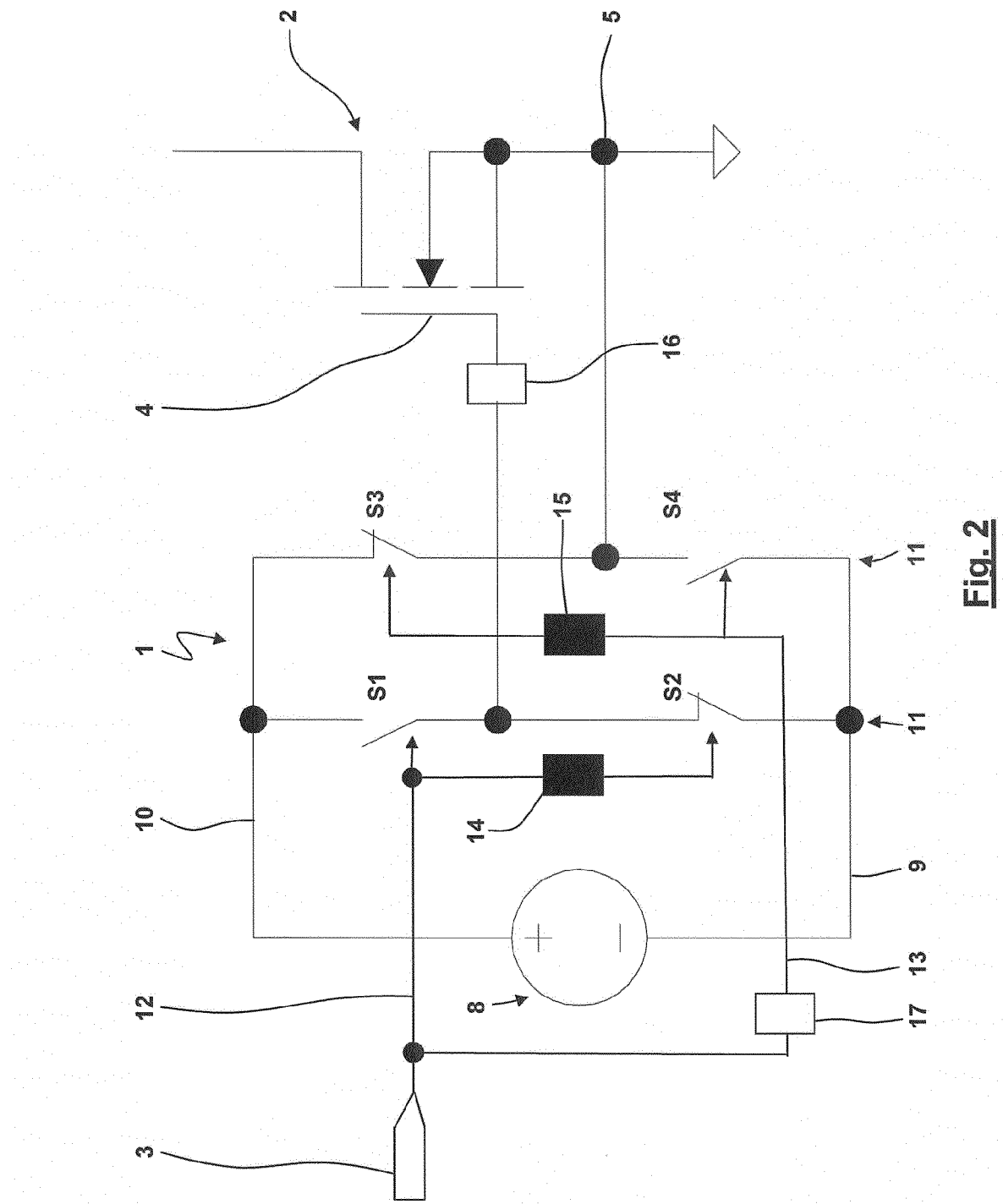
FIG. 2 depicts a basic circuit diagram of a second embodiment of the new driver circuit.

Each of the driver components 6 and 7 as depicted in FIG. 1 forms a half-bridge 11 between the poles 9 and 10 of the driver supply voltage. This becomes apparent in FIG. 2, which shows another embodiment of the driver circuit 1 in which the half-bridges 11, for the purpose of clarification, are each depicted as discrete switches S1 and S2/S3 and S4. These switches alternately connect the electrodes 4 and 5 to the two poles 9 and 10 of the supply voltage 8. In FIG. 2, the switches S2 and S3 are closed while switches S1 and S4 are open, which means that the control electrode 4 has a negative potential as compared to the reference electrode 5. When the situation is reversed and switches S1 and 54 are closed while switches S2 and S3 are open, the control electrode 4 has a positive potential as compared to the reference electrode 5. The switches S1 to S4 are controlled by activation signals 12 and 13, which are inverted between the switches S1 and S2 or S4 and S3 by inverters 14 or 15, respectively. The activation signal 12 changes its status or value together with the control signal 3. However, an expander 16 is provided between the switches S1 and S2 on one side and the control electrode 4 on the other side to extend the duration of a potential transition at the control electrode 4 as a result of switching over the switches S1 and S2 so that a prolonged and steady potential transition at the control electrode 4 occurs after each transition of the control signal 3. Instead of an expander, a delay 17 is provided for activation signal 13 to delay the transitions of the activation signal 13 with respect to the underlying transitions of the control signal 3. As a result, the potential transition at the reference electrode 5 is delayed rather than prolonged after each transition of the control signal 3. The purpose of these measures is explained in the following.

Figure 3A:
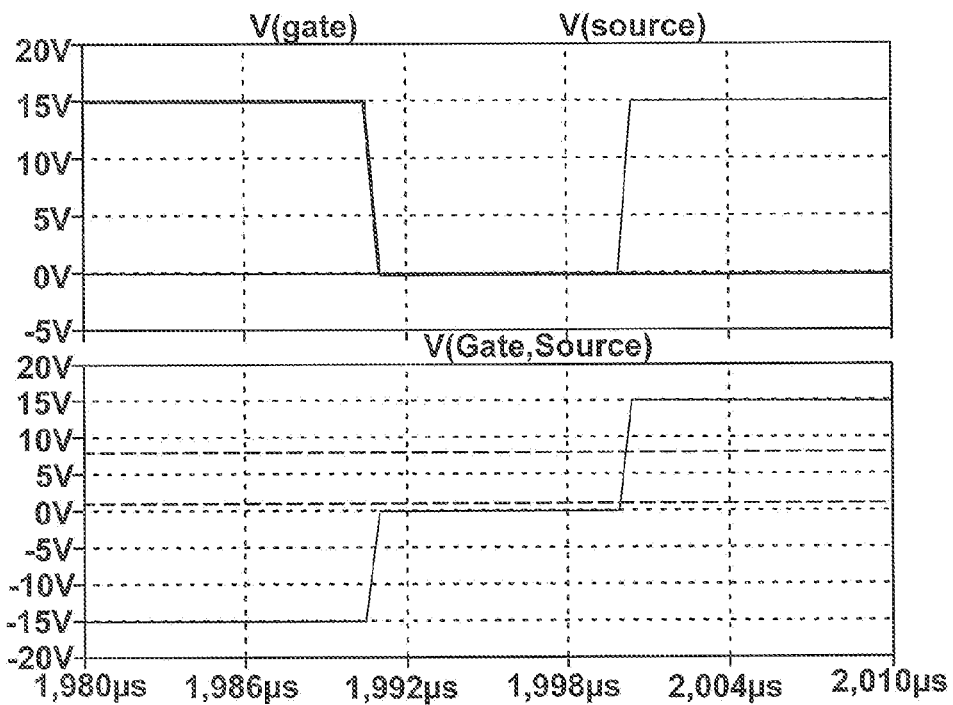
FIGS. 3a and 3b depict examples of theoretical potential curves at the control electrode and the reference electrode of a semiconductor power switch controlled by the new driver circuit, as well as the resulting potential difference between the two electrodes for both directions of change in a digital control signal that is executed via the driver circuit.
Figure 3B:
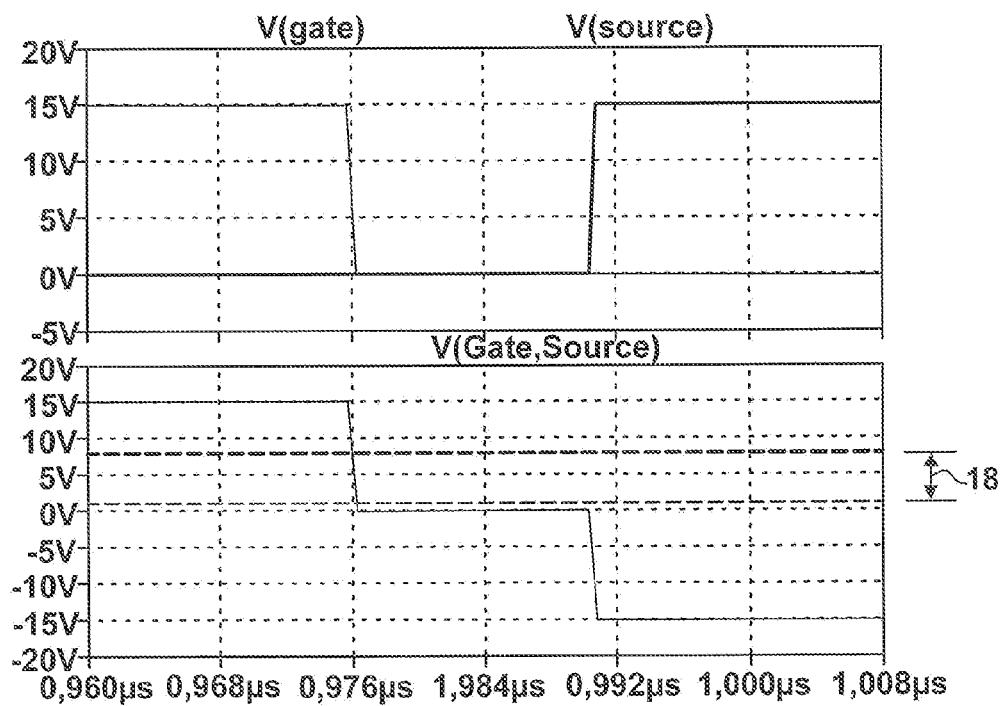

FIGS. 3a and 3b depict the theoretical potential curves at the control electrode 4 (gate) and the reference electrode 5 (source) as well as the resulting potential difference between the electrodes 4 and 5 (gate-source) given a theoretical turn-on process (FIG. 3a)) and a theoretical turn-off process (FIG. 3b)) with the driver circuit 1 shown in FIG. 1. The potential transitions at both electrodes 4 and 5 do not occur at the same exact time. Instead, the transition period of the potential of the reference electrode 5 (source) is slightly delayed with respect to the transition period of the potential of the control electrode 4 (gate). This brings the potential difference between the electrodes (gate-source) down to zero in the interim. This is non-critical for the depicted potential curves with a switching range 18 of the semiconductor power switch 2 according to FIG. 1 being in a range of a positive potential difference of about 5 volts.

Figure 4:
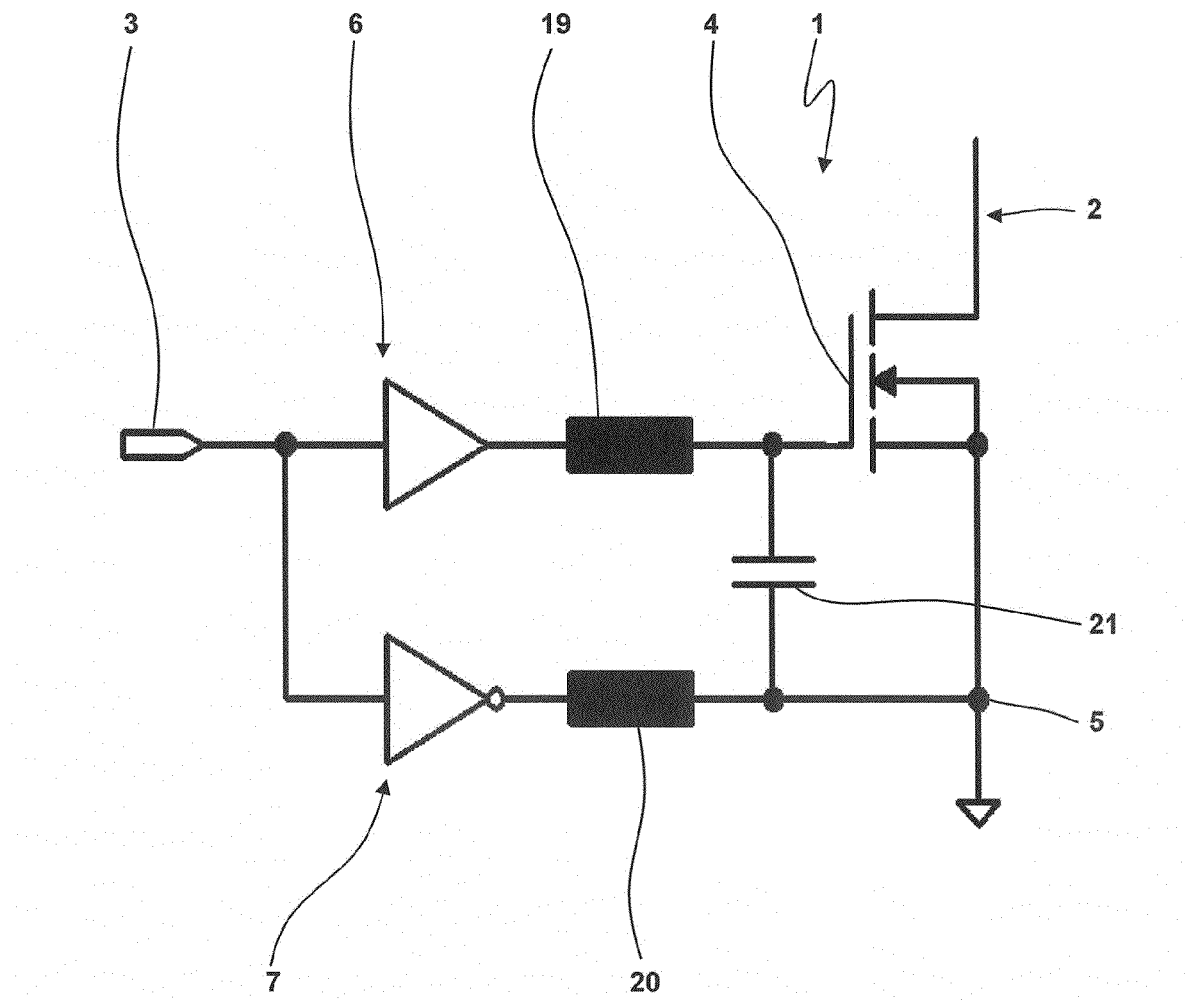
FIG. 4 outlines the parasitic inductances and input capacities of the semiconductor power switch which are present in the driver circuit as per FIG. 1.
Figure 5A:
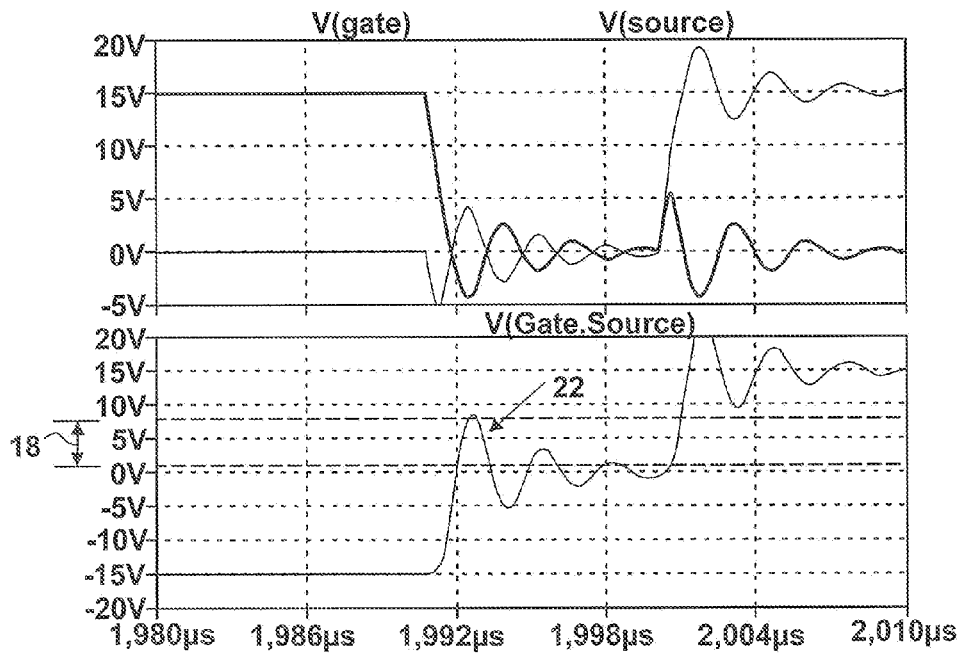
FIGS. 5a and 5b illustrate the effects parasitic elements as per FIG. 4 may have on the potential curves.
Figure 5B:
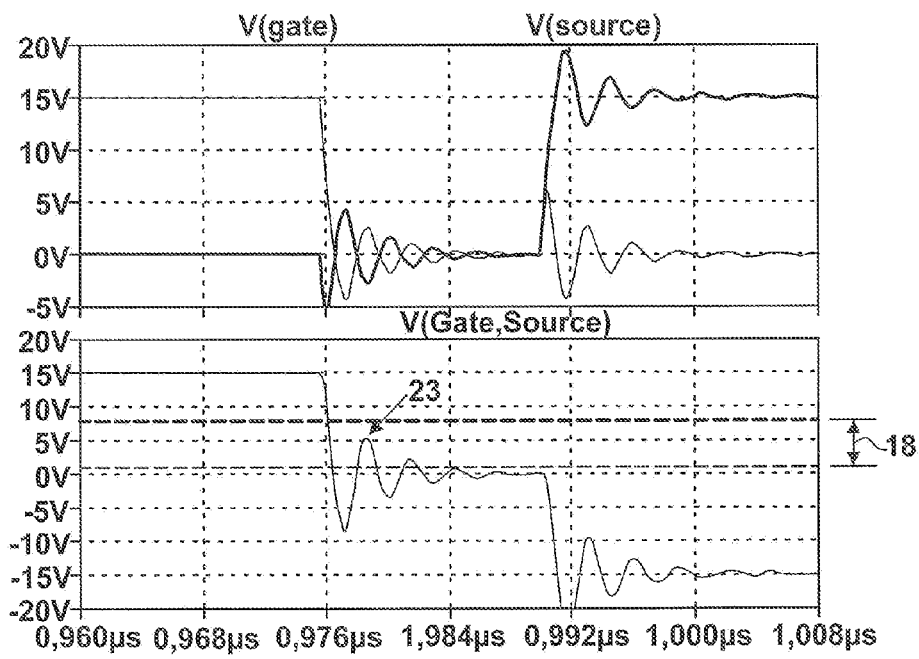

However, the potential curves according to FIGS. 3a and 3b are not realized in practice because the parasitic elements described in FIG. 4 (line inductances 19 and 20 and an input capacitance 21 of the semiconductor power switch) form an oscillating circuit that can be induced to oscillate via the fast potential transitions at the electrodes 4 and 5. The resulting potential curves are shown in FIGS. 5a and 5b. These potential curves display unintentional potential oscillations 22 and 23 that extend into the switching range 18 of the semiconductor power switch 2 and that switch it on and off again in the interim before the semiconductor power switch finally reaches its desired switching status. FIGS. 5a and 5b only show a single oscillation 22 or 23 for both the turn-on process (FIG. 5a)) and the turn-off process (FIG. 5b)). More than one oscillation of this kind may however occur that result in an unwanted switching cycle of the semiconductor power switch 2.

These unwanted switching cycles could generally be countered by minimizing the line inductances 19 and 20 and synchronizing the potential transitions at the electrodes 4 and 5. Making sure in this way that unwanted switching cycles never occur, however, requires a significant amount of effort. Rather than do that, the present invention prolongs the transition period of the potential of one electrode and delays the beginning of the transition period of the potential of the other electrode with respect to the transition period of the other potential of the one electrode so that the faster potential transition occurs during the slower potential transition. The delay of the faster transition period furthermore depends on whether the respective power switch 2 is turned on or off. In consequence, the switching range 18 of the semiconductor power switch 2 is always passed through during the fast potential transition at the other electrode without resulting potential oscillations reaching this switching range again and thus leading to unwanted switching cycles. The expander 16 and delay 17 depicted in FIG. 2 are provided for this purpose.

Figure 6A:
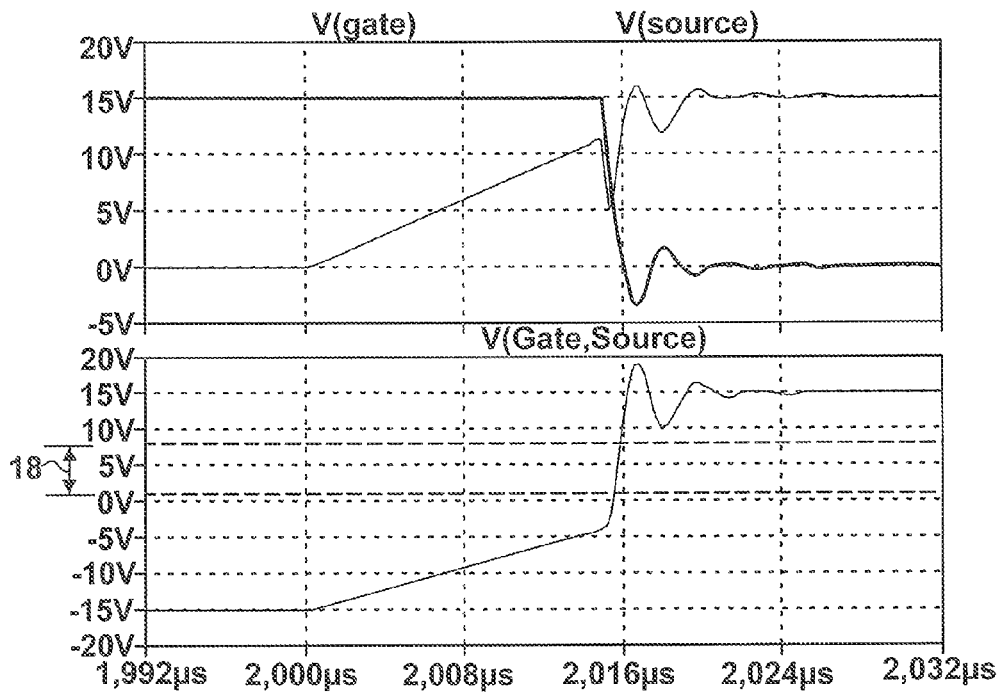
FIGS. 6a and 6b illustrate potential curves of the present invention as well as the resulting potential difference between the two electrodes of the semiconductor switch.
Figure 6B:
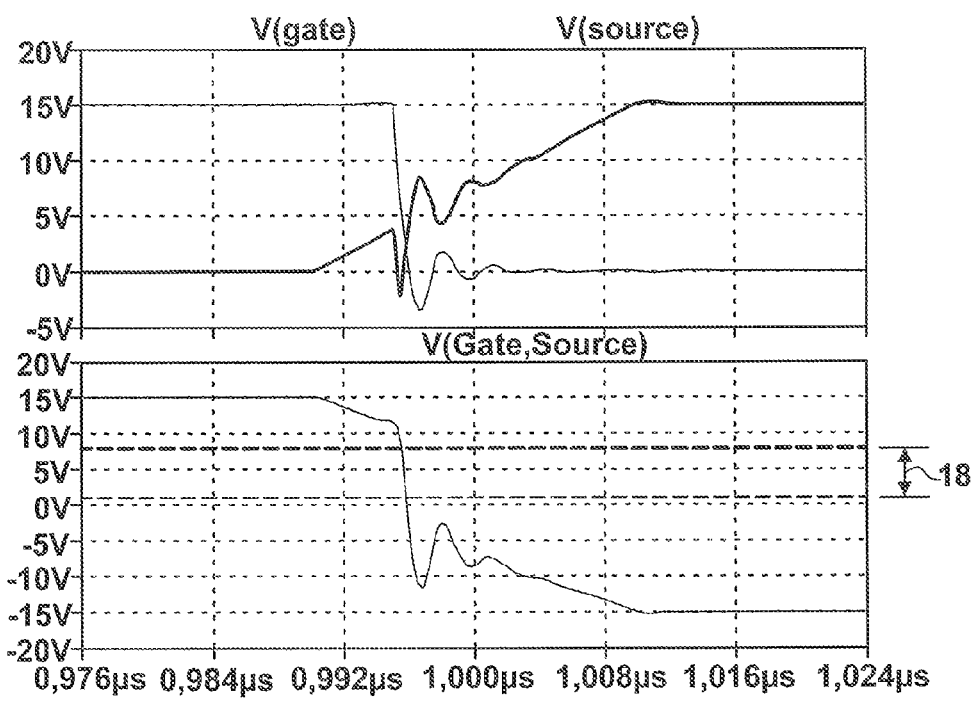

FIGS. 6a and 6b illustrate how these measures function. Unlike the embodiment depicted in FIG. 1, the transition period of the potential of the control electrode 5 (source) is prolonged while the transition period of the potential of the control electrode 4 (gate) is delayed in FIGS. 6a and 6b. The prolonged potential transition does not induce potential oscillations and brings the potential difference close to the switching range 18 before the faster potential transition at the control electrode (gate) begins and the potential difference quickly passes through the switching range 18. The induced potential oscillations are outside of the switching range 18.

Figure 7:
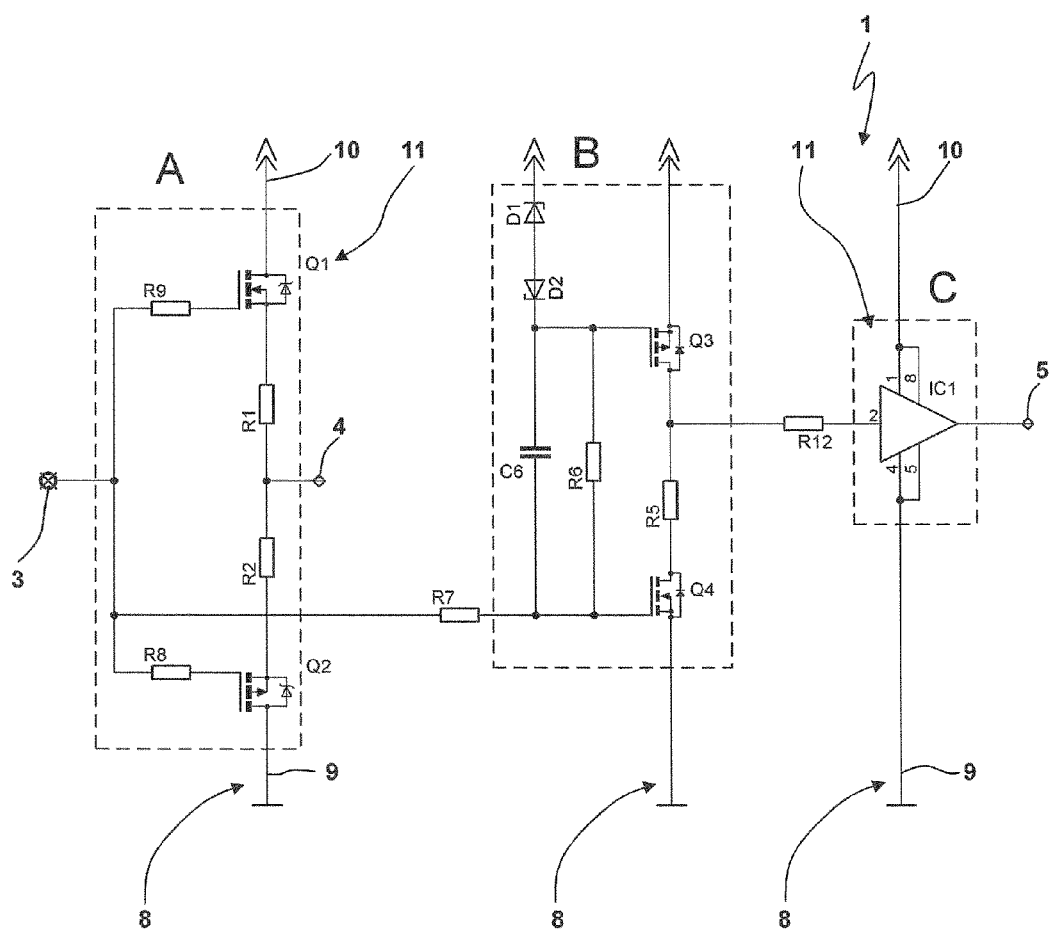
FIG. 7 illustrates an embodiment of the driver circuit that is designed to achieve the potential curves in FIGS. 6a and 6b.

FIG. 7 outlines an actual driver circuit 1 for achieving the potential transitions as per FIGS. 6a and 6b, but does not show the semiconductor power switch for which the driver circuit 1 is provided. In addition, the driver circuit 1 according to FIG. 7—like the one shown in FIG. 2—is provided for a prolonged potential transition at the control electrode 4 (gate) and a delayed albeit fast potential transition at the reference electrode 5 (source). The driver circuit 1 according to FIG. 7 can theoretically be divided into three blocks A, B, and C. A voltage follower A, which is used to activate the control electrode 4, features a high current gain despite a voltage gain of less than 1. Resistors R1 and R2 serve to limit the maximum output current of the voltage follower A (i.e., the charge current of the input capacity of the semiconductor power switch). The gate resistors R8 and R9 of the transistors Q1 and Q2, which correspond to the switches S1 and S2 shown in FIG. 2, are used to adjust the speed of the potential transition when switching the control electrode 4 between the two poles of the driver supply voltage.

The reference electrode 5 is controlled by an integrated driver circuit C. The potential transition at the reference electrode should occur quickly when switching between the poles of the driver supply voltage 8. An upstream phase inverter B brings about the required inversion of the control signal 3 with respect to the activation of the driver circuit C. It also induces the desired delay since the fast driver circuit C only starts working when the potential transition at the control electrode 4 has already occurred to some degree. The capacitor C6 and diodes D1 and D2 of the phase inverter B allow a bias voltage to be generated at the gate of the transistor Q3. This consequently shortens the time interval during which the two transistors Q3 and Q4 are conductive and coordinated delays can be set for switching the semiconductor power switch (not shown here) on and off. A resistor R5 limits the current through the transistors Q3 and Q4 during the remaining overlap.

Many variations and modifications may be made to the embodiments of the invention without departing substantially from the spirit and principles of the invention. All such modifications and variations are intended to be included herein within the scope of the present invention, as defined by the following claims.

The invention claimed is:

1. A method of operating a semiconductor power switch having a control electrode and a reference electrode in response to a first switching command and a second switching command included in a control signal, the method comprising:
   providing a control voltage between a first electric pole and a second electric pole;
   upon each first switching command, coupling the control electrode to the first electric pole, and the reference electrode to the second electric pole; and
   upon each second switching command, coupling the control electrode to the second electric pole, and the reference electrode to the first electric pole,
   wherein, upon each first switching command and second switching command, coupling one of the control electrode and the reference electrode to one of the first electric and the second electric pole comprises continuously transitioning an electric potential of the one of the control electrode and the reference electrode during a first transition period, and coupling the respective other of the control electrode and the reference electrode to the respective other of the first electric pole and the second electric pole comprises continuously transitioning an electric potential of the respective other of the control electrode and the reference electrode during a second transition period, and
   wherein the first transition period begins before and ends after the second transition period.

2. The method of claim 1, wherein the first transition period is prolonged as compared to the second transition period and an initiation of the second transition period is delayed as compared to an initiation of the first transition period, such that a period is minimized during which the potential difference between the control electrode and the reference electrode is within a switching range of the power semiconductor switch.

3. The method of claim 1, wherein each first switching command comprises a change from a first value of the control signal to a second value of the control signal, and wherein each second switching command comprises a change from the second value of the control signal to the first value of the control signal.

4. The method of claim 3, wherein one of the first value and the second value of the control signal is a logical zero and the respective other value is a logical one.

5. The method of claim 1, wherein an electric potential of the one of the control electrode and the reference electrode is steadily transitioned during the first transition period.

6. The method of claim 5, wherein the electric potential of the one of the control electrode and the reference electrode is linearly transitioned during the first transition period.

7. The method of claim 1, wherein the first transition period is prolonged as compared to the second transition period by at least a factor of three.

8. The method of claim 7, wherein the first transition period is prolonged as compared to the second transition period by a factor in a range from three to fifty.

9. The method of claim 8, wherein the first transition period is prolonged as compared to the second transition period by a factor in a range from five to ten.

10. The method of claim 1, wherein an initiation of the second transition period is delayed with respect to an initiation of the first transition period by 10% to 90% of a duration of the first transition period.

11. The method according to claim 10, wherein the initiation of the second transition period is delayed with respect to the initiation of the first transition period by 20% to 80% of the duration of the first transition period.

12. A driver circuit for operating a semiconductor power switch having a control electrode and a reference electrode, the driver circuit comprising:
   a first half-bridge circuit configured to alternately couple one of the control electrode and the reference electrode to a first electric pole and to a second electric pole of a control voltage;
   a second half-bridge circuit configured to alternately couple the respective other of the control electrode and the reference electrode to the second electric pole and to the first electric pole of the control voltage; and
   control circuitry configured to operate the first half-bridge circuit and the second half-bridge circuit in response to a first switching command and a second switching command included in a control signal, such that, upon each first switching command, the control electrode is coupled to the first electric pole, and the reference electrode is coupled to the second electric pole and, upon each second switching command, the control electrode is coupled to the second electric pole, and the reference electrode is coupled to the first electric pole, and wherein the control circuitry is further configured to, upon each first switching command and second switching command, continuously transition an electric potential of the one of the control electrode and the reference electrode during a first transition period of the first half-bridge circuit, and continuously transition an electric potential of the respective other of the control electrode and the reference electrode during a second transition period of the second half-bridge circuit,
   wherein the first transition period begins before and ends after the second transition period.

13. The driver circuit of claim 12, wherein the control circuitry is configured to prolong the first transition period as compared to the second transition period and to delay an initiation of the second transition period as compared to an initiation of the first transition period, such that a period is minimized during which the potential difference between the control electrode and the reference electrode is within a switching range of the power semiconductor switch.

14. The driver circuit according to claim 13, wherein the control circuitry is configured to operate the second half-bridge circuit at a delay as compared to the first half-bridge circuit which varies between the first switching command and the second switching command.

15. The driver circuit of claim 12, wherein the one of the control electrode and the reference electrode is a semiconductor power switch control electrode and the respective other of the control electrode and reference electrode is a semiconductor power switch reference electrode.

16. A driver circuit configured to drive a semiconductor power switch having a control electrode and a reference electrode, comprising:
   a first switch circuit configured to alternately couple one of the control electrode and the reference electrode to a first electric pole and to a second electric pole of a control voltage;
   a second switch circuit configured to alternately couple the respective other of the control electrode and the reference electrode to the second electric pole and to the first electric pole of the control voltage; and
   a control circuit configured to control the first switch circuit and the second switch circuit in response to a first switching command and a second switching command provided in a control signal provided thereto, wherein upon each first switching command the control circuit controls the first switch circuit and the second switch circuit such that the control electrode is coupled to the first electric pole and the reference electrode is coupled to the second electric pole, wherein upon each second switching command the control circuit controls the first switch circuit and the second switch circuit such that the control electrode is coupled to the second electric pole and the reference electrode is coupled to the first electric pole, wherein upon each first switching command and second switching command the control circuit controls the first switch circuit and the second switch circuit to transition an electric potential of one of the control electrode and the reference electrode during a first transition period, and transition an electric potential of the respective other of the control electrode and the reference electrode during a second transition period, and wherein the first transition period begins before the second transition period, and ends after the second transition period.

17. The driver circuit of claim 16, wherein the first transition period is at least three times as long as the second transition period.

18. The driver circuit of claim 16, wherein an initiation of the second transition period is delayed with respect to an initiation of the first transition period by 10% to 90% of a duration of the first transition period.

19. The driver circuit of claim 16, wherein the control circuit comprises an expander component configured to extend a duration of a potential transition at the control electrode.

20. The driver circuit of claim 16, wherein the control circuit comprises a delay component configured to delay an initiation of a potential transition at the reference electrode compared to an initiation of a potential transition at the control electrode.

* * * * *